US005949112A

United States Patent [19]
Gossmann et al.

[11] Patent Number: 5,949,112
[45] Date of Patent: Sep. 7, 1999

[54] INTEGRATED CIRCUITS WITH TUB-TIES

[75] Inventors: Hans-Joachim Ludwig Gossmann, Summit; Thi-Hong-Ha Vuong, Berkeley Heights, both of N.J.

[73] Assignee: Lucent Technologies Inc., Murray Hill, N.J.

[21] Appl. No.: 09/085,913

[22] Filed: May 28, 1998

[51] Int. Cl.[6] ............................ H01L 29/76; H01L 29/94; H01L 31/062; H01L 31/113

[52] U.S. Cl. ........................... 257/369; 257/369; 257/204; 257/206; 257/338; 257/351; 257/357; 257/376; 257/371; 257/213

[58] Field of Search ..................................... 257/204, 206, 257/338, 351, 357, 376, 369, 371, 213

[56] References Cited

U.S. PATENT DOCUMENTS

| | | | |
|---|---|---|---|
| 4,905,073 | 2/1990 | Chen et al. ................................. | 357/67 |
| 5,571,745 | 11/1996 | Horiuchi ..................................... | 437/57 |

OTHER PUBLICATIONS

U. Schwalke et al., EXTIGATE . . . , 27th European Solid–State Research Conference, Stuttgart, Germany, Sep. 22–24, 1996, pp. 317–320.
U. Schwalke et al., Advanced Gate–Stack . . . , 1997 Symposium on VLSI Technology, Jun. 10–12, 1997, Digest of Technical Papers, pp. 71–72.
C. P. Chang et al., A Highly Manufacturable . . . , 1997 IEDM, Dec. 7–19, 1997, Technical Digest., pp. 661–665 (1997).

*Primary Examiner*—Carl Whitehead, Jr.
*Assistant Examiner*—Matthew Warren

[57] ABSTRACT

An IC comprises a tub of a first conductivity type, at least one transistor embedded in the tub, and a first pair of isolating regions defining therebetween a tub-tie region coupled to the tub. The tub-tie region comprises a cap portion of the first conductivity type and an underlying buried pedestal portion of a second conductivity type. At least a top section of the pedestal portion is surrounded by the cap portion so that a conducting path is formed between the cap portion and the tub. In a CMOS IC tub-ties of this design are provided for both NMOS and PMOS transistors. In a preferred embodiment, the cap portion of each tub-tie comprises a relatively heavily doped central section and more lightly doped peripheral sections, both of the same conductivity type. In accordance with another aspect of our invention, a reduced-mask-count CMOS IC process includes forming the isolating regions so that each has a protrusion which extends over the surface regions where the peripheral sections of the cap portion are to be formed. Then, a combination of ion implantation energies and concentrations, as well as suitable PR masking, in conjunction with the shape of the isolating regions, enables selective doping of the pedestal portion.

9 Claims, 5 Drawing Sheets

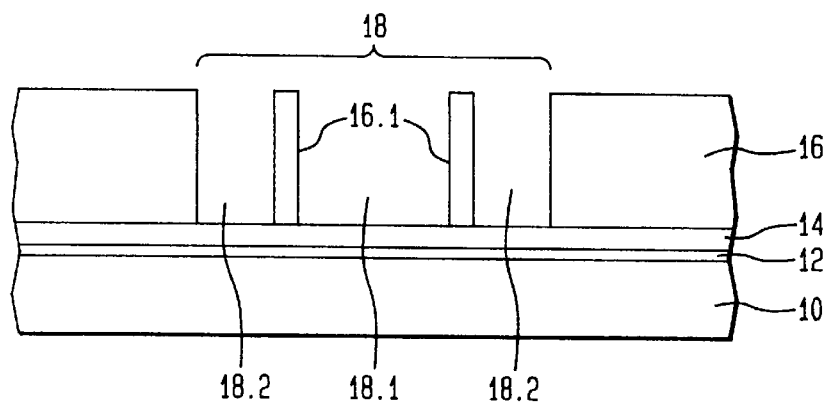
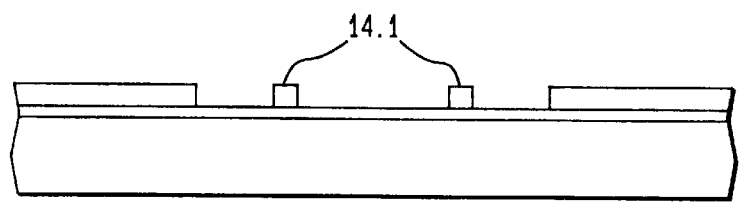
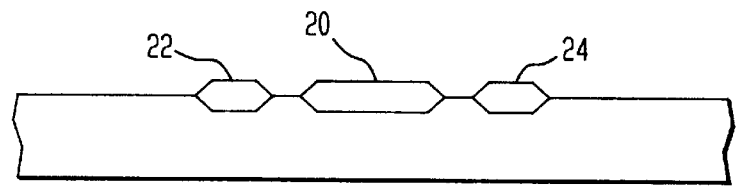
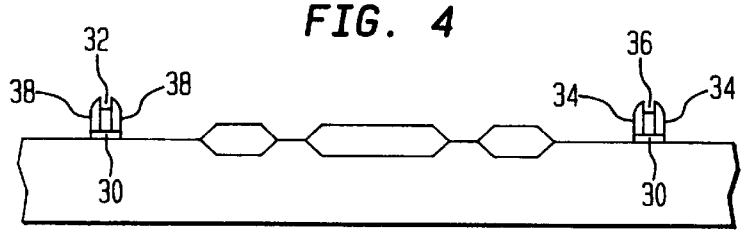
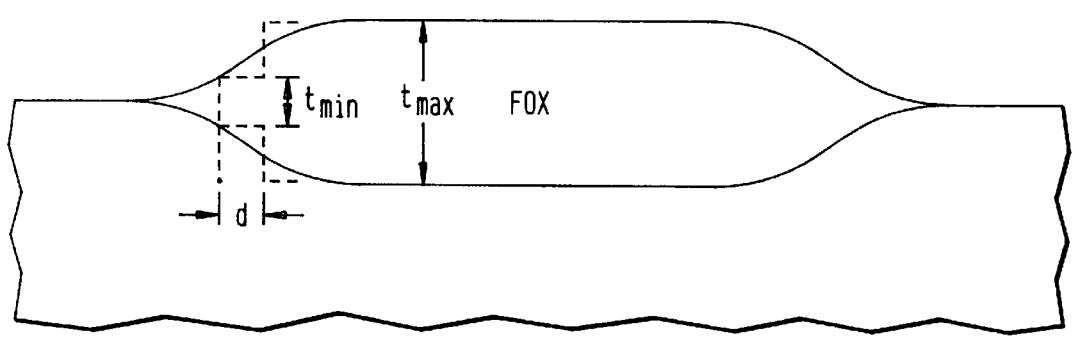

INTEGRATED CIRCUITS WITH TUB-TIES

FIELD OF THE INVENTION

This invention relates generally to integrated circuits (ICs) and, more particularly, to a process and design for making tub-ties in ICs.

BACKGROUND OF THE INVENTION

In conventional CMOS (complementary metal oxide semiconductor) technology NMOS transistors are embedded in a p-type tub, and, conversely, PMOS transistors are embedded in an n-type tub. Each tub serves to isolate the transistors therein from the bulk substrate and from transistors in the other tub. However, the tubs should not be left floating; i.e., they should be connected to either $V_{cc}$ or to ground in order to prevent latch-up. For this purpose special conducting paths, known as tub-ties, establish ohmic connections between appropriate metal layers (the tub-tie contacts) and each of the tubs. Not every transistor needs a tub-tie, but every tub needs at least one tub-tie. Typically, the area of a tub-tie at the surface of the semiconductor is relatively small, measuring only about 1 $\mu$m×1 $\mu$m. In LOCOS (local oxidation of silicon) isolation of the tub-tie is formed in zones of silicon located between regions of isolating field oxide (FOX), whereas in STI (shallow trench isolation) it is formed in small pillars of silicon disposed between isolating oxide-filled trenches.

In standard CMOS front-end processing (i.e., processing up to but not including metalization), which usually entails about ten different photolithographic mask steps to fabricate the transistors, the source/drain (S/D) regions are typically doped heavily, whereas the tubs are only lightly doped. The tub-tie regions are also heavily doped, usually during the same ion implantation step that dopes the S/D regions. Doping of the n-type tub-tie region of the PMOS transistors, for example, is accomplished by opening a hole over the tub-tie location in the photoresist (PR) mask that protects the PMOS transistor locations during the n-type ion implantation of the S/D regions of the NMOS transistors. Conversely, doping of the p-type tub-tie region of the NMOS transistors is accomplished by opening a hole over the tub-tie location in the PR mask that protects the NMOS transistor locations during the p-type ion implantation of the S/D regions of the PMOS transistors.

However, IC fabrication processes which require a large number of PR mask steps are undesirable, in general implying lower yields and higher cost than processes which utilize fewer PR mask steps. Consequently, workers in the IC art have endeavored to reduce the number of PR mask steps required. See, for example, T. Horiuchi, U.S. Pat. No. 5,571,745 issued on Nov. 5, 1996, U. Schwalke et al., *European Solid-State Device Research Conference*, Conf Proc., pp. 317–320 (1996), and U. Schwalke et al, Symposium On VLSI Technology, Digest of Technical Papers, pp. 71–73 (1997). While the various prior art implementations differ, they all accomplish PR mask reduction by combining two or more implant steps, such as tub implants with gate implants. The most aggressive approach, which entails the largest cost reduction, combines all implants into a single PR mask step. However, in so doing the PR mask previously utilized to allow selective doping of the tub-tie regions is no longer available. Thus, a need remains in the art for a reduced-mask-count IC process that enables tub-tie regions to be formed.

SUMMARY OF THE INVENTION

In accordance with one aspect of our invention, an IC comprises a tub of a first conductivity type, at least one transistor embedded in the tub, and a first pair of isolating regions defining therebetween a tub-tie region coupled to the tub. The tub-tie region comprises a cap portion of the first conductivity type and an underlying buried pedestal portion of a second conductivity type. At least a top section of the pedestal portion is surrounded by the cap portion so that a conducting path is formed between the cap portion and the tub. In a CMOS IC an n-type tub tie of this design is provided for PMOS transistors in n-type tubs, and a p-type tub-tie of this design is provided for NMOS transistors in p-type tubs. In a preferred embodiment, the cap portion of each tub-tie comprises a relatively heavily doped central section and more lightly doped peripheral sections, both of the same conductivity type.

In accordance with another aspect of our invention, a reduced-mask-count CMOS IC process includes forming the isolating regions so that each has a protrusion which extends over the surface regions where the peripheral sections of the cap portion are to be formed. Then, a combination of ion implantation energies and concentrations, as well as suitable PR masking, in conjunction with the shape of the isolating regions, enables selective doping of the pedestal portion and the cap portion (central and peripheral sections).

Illustratively, the isolating regions are FOX regions formed by a LOCOS process or TOX (trench oxide) regions formed by an STI process.

BRIEF DESCRIPTION OF THE DRAWING

Our invention, together with its various features and advantages, can be readily understood from the following more detailed description taken in conjunction with the accompanying drawing, in which:

FIGS. 1–8 are schematic, cross-sectional views of a CMOS IC at various, sequential stages of its front-end fabrication utilizing a LOCOS process in accordance with one embodiment of our invention;

FIGS. 9–10 are schematic, cross-sectional views of a portion of a CMOS IC depicting a basic design of a tub-tie in accordance with our invention; FIGS. 9A and 9B show a p-type tub-tie at different stages of its fabrication, whereas FIG. 11 is a schematic showing how the curved, tapered ends of LOCOS FOX approximate the protrusion described with reference to FIGS. 9–10.

Figure 5:
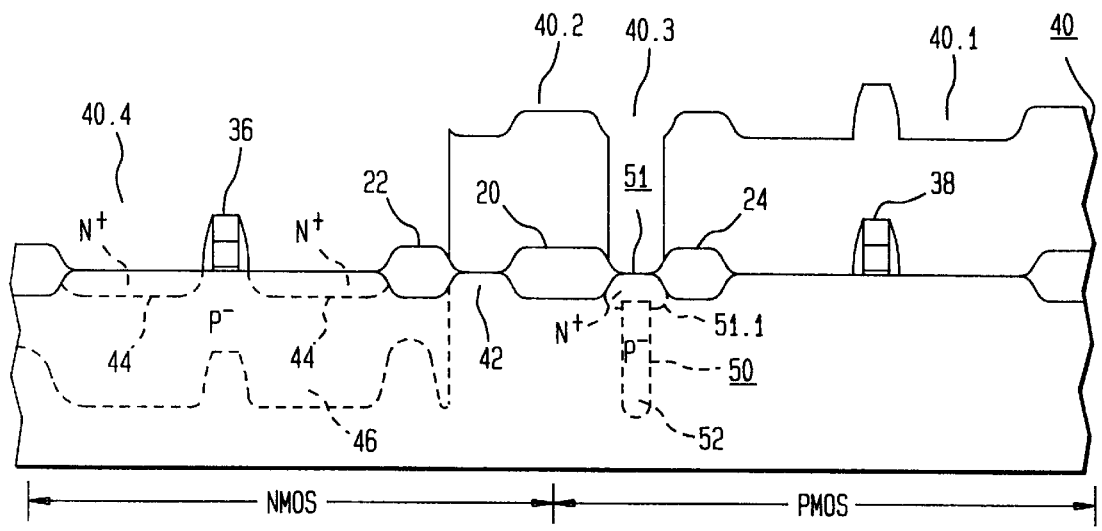
Figure 6:
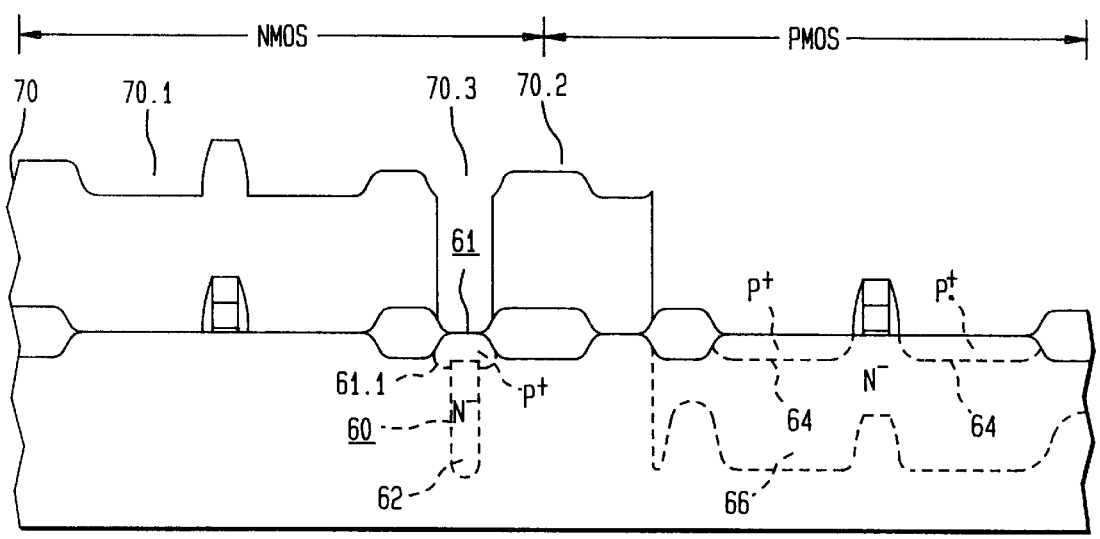

In the interest of clarity and simplicity, these figures are not drawn to scale. Note that the apparent scale of FIGS. 5–6 is larger than that of FIGS. 1–4 but smaller than that of FIGS. 7–8;. In addition, elements in FIGS. 9–10 corresponding to those of FIGS. 1–8 have been given the same reference numbers as in the latter figures but increased by 100.

Moreover, for purposes of clarity only, in the Detailed Description which follows, a double dash is used in the exponents of the conductivity terms n<sup>−−</sup>-type and p<sup>−−</sup>-type because a single dash is difficult to see. The double dash exponent is intended to designate that the semiconductor is lightly doped, but not necessarily that it is very lightly doped (contrary to the normal usage in the IC art).

DETAILED DESCRIPTION OF THE INVENTION

General Tub-Tie Structure and Fabrication

Figure 9A:
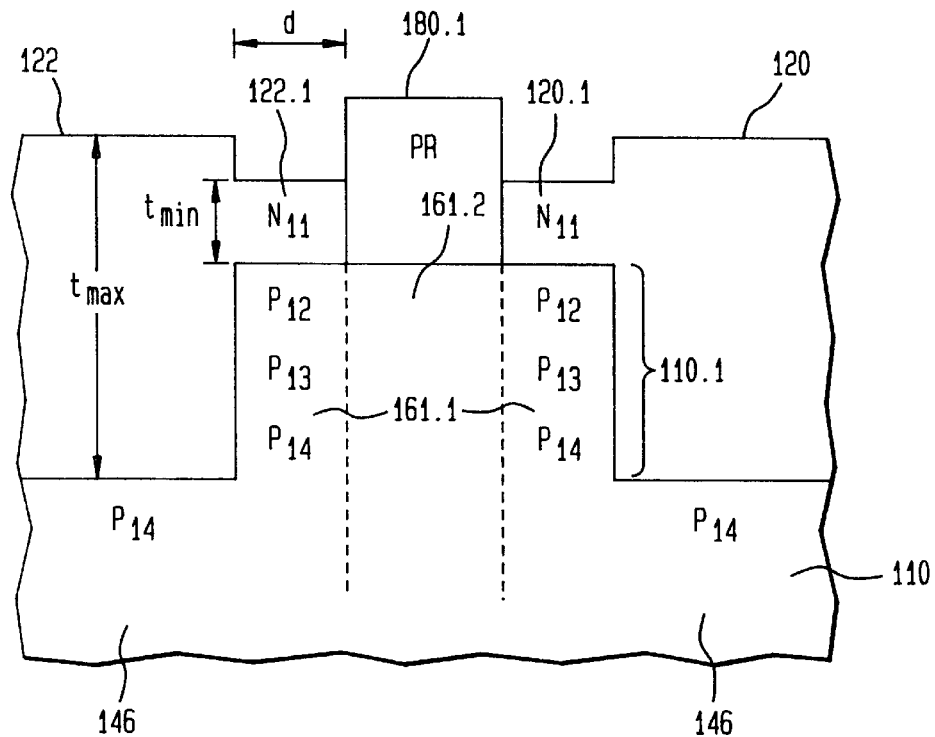
Figure 9B:
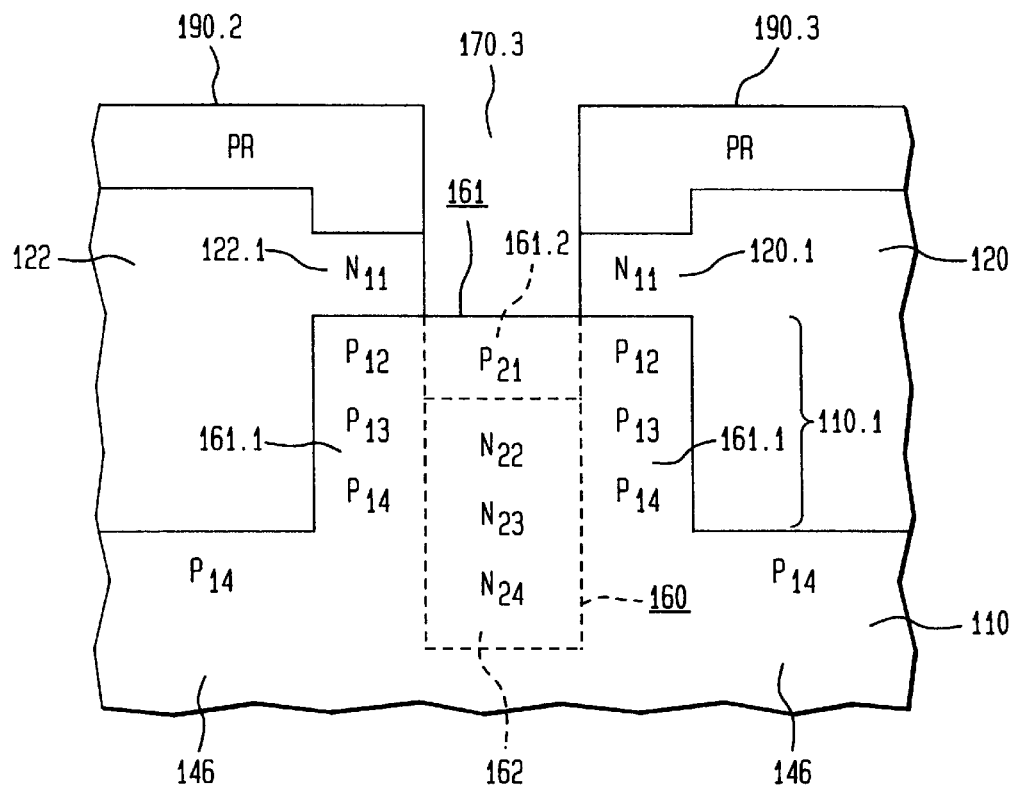

Beginning first with FIG. 9B, we show schematically a p-type tub-tie realized by a reduced-mask-count IC process.

The tub itself is designated 146, the tub-tie contact (not shown) would be formed in opening 170.3, and the tub-tie region 160 includes a pedestal portion 162 and a cap portion 161. The latter electrically couples (i.e., ties) the contact to the tub. More specifically, the IC includes a semiconductor body 110 having a raised feature 110.1 in which the tub-tie region is to be formed. The raised feature is bounded by electrically isolating regions 120 and 122 each of which has a protrusion 120.1 and 122.1, respectively, overlaying peripheral sections 161.1 of feature 110.1 and hence of the tub-tie region.

The tub-tie region 160 comprises an n-type buried pedestal portion 162 and a p-type cap portion 161. The cap portion 161 surrounds at least a top section of the pedestal portion 162. Illustratively, the cap portion includes a relatively highly doped central section 161.2 and a more lightly doped peripheral section(s) 161.1, all of which are p-type. In principle, however, only one peripheral section 161.1 is needed to establish electrical connectivity to the tub 146. Thus, even if the left hand peripheral section were n-type, allowing the pedestal portion to pinch-off the conducting path between isolating region 122 and pedestal portion 162, the right hand peripheral section would still provide the needed connectivity between the cap portion 161 and the tub 146. Note, of course, the peripheral sections could be part of a cylindrical structure, in which case the left and right handedness exists only in cross-section.

Figure 10A:
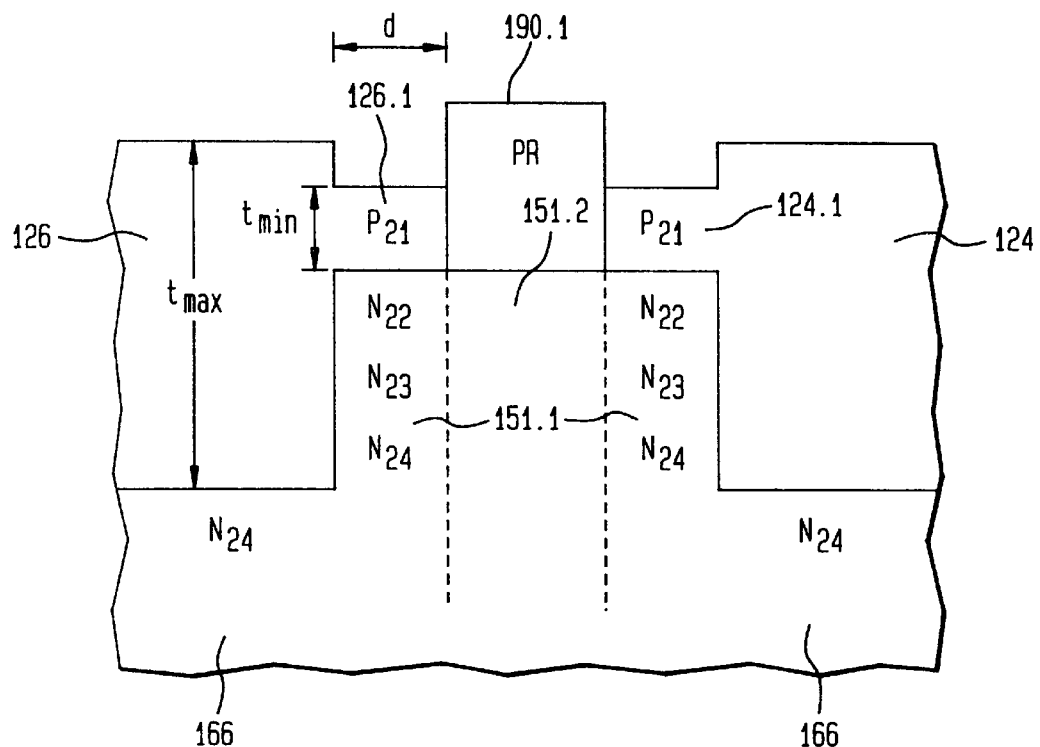
FIGS. 10A and 10B show an n-type tub-tie at the same stages as FIGS. 9A and 9B, respectively.
Figure 10B:
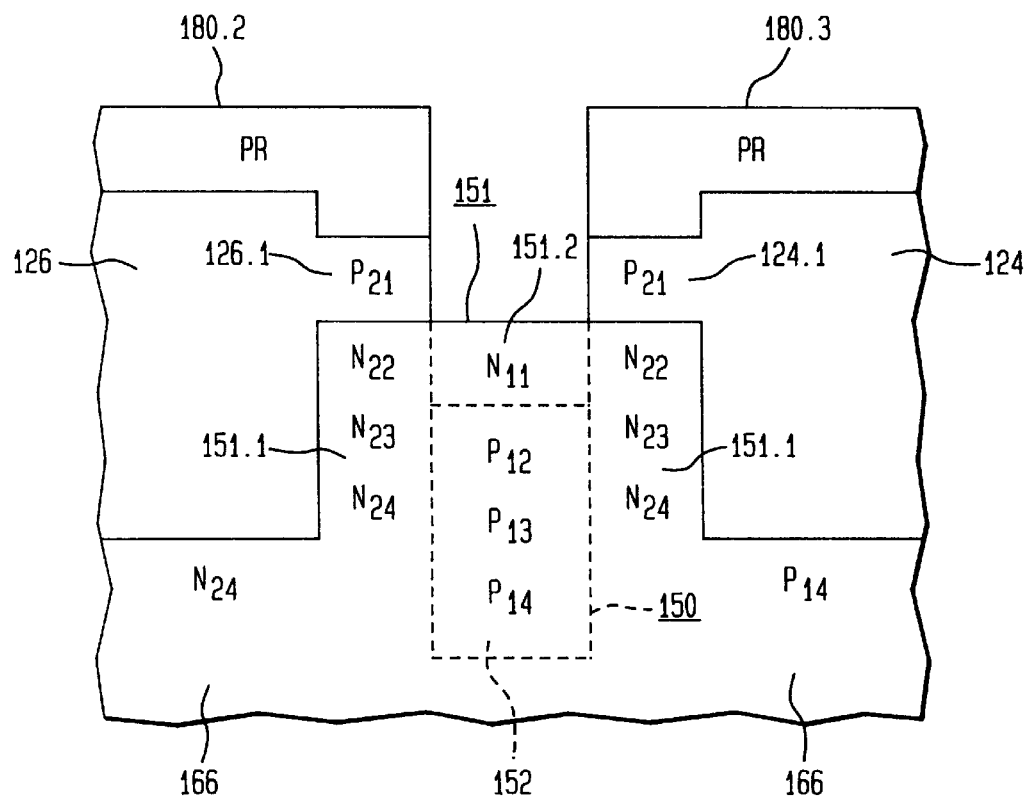

Similarly, FIG. 10B depicts an n-type tub-tie of the same design as the p-type tub-tie of FIG. 9B, except that the conductivity types have been reversed.

The tub-tie structure of FIGS. 9 and 10 can be realized utilizing a variety of IC fabrication processes, such as LOCOS and STI, as will be described more fully hereinafter. However, in general the process exploits the shape of the isolating regions 120, 122, 124 and 126 to selectively dope the raised semiconductor feature 110.1 to produce the desired cap portions 151 and 161. In particular, we control the thickness of the isolating regions in various parts thereof (e.g., in the protrusions 120.1, 122.1, 124.1 and 126.1) to impede penetration of implanted ions of a first conductivity type (e.g., n-type), yet permit penetration of ions of a second conductivity type (e.g., p-type).

In the following discussion, we have adopted a notation $P_{ij}$ (i=1,2; j=1,2,3, . . . ) and $N_{ij}$ (i=1,2; j=1,2,3, . . . ) to indicate that certain regions are either p-type ($P_{ij}$) or n-type ($N_{ij}$), with the subscript i designating first and second fabrication cycles, and the subscript j designating that different regions may have different dopant concentrations and/or may have been implanted with dopants during different steps in the IC fabrication process.

Consider first FIGS. 9A and 10B which depict p-type and n-type tub-ties, respectively, during a first stage of the tub-tie fabrication process. After the raised feature 110.1 is formed in the semiconductor body 110 and after the isolating regions 120, 122, 124 and 126 are also formed so as to have the desired protrusions 120.1, 122.1, 124.1 and 126.1, respectively, a mask (e.g., PR) is deposited on the wafer. The mask is patterned so that mask segment 180.1 (FIG. 9A) blocks the opening between the protrusions 120.1 and 122.1 of the p-type tub-tie (FIG. 9A) and mask segments 180.2 and 180.3 cover the isolating regions 126 and 124, including the protrusions 126.1 and 124.1 of the n-type tub-tie (FIG. 10B). During a first cycle of ion implantation steps, mask 180.1 blocks ions from penetrating the underlying semiconductor of the p-type tub-tie (FIG. 9A) where the central section 161.2 of the cap portion 161 will be formed. An implantation cycle is defined as a sequence of ion implantation steps with no intervening photolithography step (e.g., PR step). During the same cycle, the central section 151.2 and the pedestal portion 152 of the n-type tub-tie (FIG. 10B) are implanted. The converse situation holds for FIGS. 9B and 10A during a second implantation cycle.

Taking a front-end CMOS process as an illustration, we describe, in conjunction with FIGS. 9–10, the fabrication of a tub-ties to both the PMOS and NMOS transistors. The first implantation cycle would typically include a relatively shallow implantation $N_{11}$ of the n$^+$-type source/drain (S/D) (not shown) of the NMOS transistors. As shown in FIG. 9A, the thickness $t_{min}$ of protrusions 120.1 and 122.1 and the implant energies are mutually adapted to impede (essentially prevent) penetration of the $N_{11}$ implant into the underlying semiconductor raised feature 110.1 of the p-type tub-tie (FIG. 9A); i.e., the $N_{11}$ implant is absorbed by the protrusions (as well as by the adjacent thicker sections $t_{max}$ of the isolating regions). Implant $N_{11}$ also forms central section 151.2 of the cap portion 152 of the n-type tub-tie (FIG. 10B), but the mask segments 180.2 and 180.3 and the isolating regions prevent penetration of the n$^+$-type dopant into the peripheral sections 151.1 of the cap portion 151 (FIG. 10B). The first cycle also includes a multiplicity of p$^{--}$-type implants $P_{12}$, $P_{13}$ and $P_{14}$. These implants are performed at higher energies sufficient to penetrate through the protrusions into the peripheral sections 161.1 of the p-type tub-tie (FIG. 9A). However, the thickness $t_{max}$ of the isolating regions is sufficiently large to prevent penetration of the $P_{12}$ and $P_{13}$ implants therethrough, but not the $P_{14}$ implant. Illustratively, implant $P_{14}$ is a higher energy implant than $P_{13}$, implant $P_{13}$ is a higher energy implant than $P_{12}$, and $P_{12}$ is a higher energy implant than $N_{11}$. Typically, $P_{14}$ represents a p$^{--}$-type tub implant, whereas $P_{12}$ and $P_{13}$ represent a variety of well known NMOS transistor implants (e.g., a valley-fill implant, a punch-through implant, a LDD(lightly doped drain)/extension implant, a MDD (moderately doped drain) implant, and a threshold-adjust implant). The order of these implants need not follow any particular sequence; in particular, the sequence $N_{11}$, $P_{12}$, $P_{13}$ and $P_{14}$ is merely illustrative, not mandatory. The first cycle implants $P_{12}$, $P_{13}$ and $P_{14}$ also form the p$^{--}$-type pedestal portion 152 of the n-type tub-tie (FIG. 10B).

After the end of the first implantation cycle, the mask 180.1 is removed exposing the underlying semiconductor of the p-type tub-tie, in particular exposing the central section 161.2 of the cap portion 161 (FIG. 9B). In addition, another mask (e.g., PR) is formed over the wafer. This mask includes mask segments 190.2 and 190.3 over the isolating regions 120 and 122 (FIG. 9B) and a mask segment 190.1 blocking the opening between protrusions 126.1 and 124.1 of the n-type tub-tie (FIG. 10A). Mask segments 190.2 and 190.3 (FIG. 9B) prevent ions implanted during the second cycle from penetrating through the protrusions 120.1 and 122.1, whereas mask segment 190.1 (FIG. 10A) prevents implantation in the region where the central section 151.2 of the cap portion 151 of the n-type tub-tie is to be formed. The second cycle includes implantation $P_{21}$ of the p$^+$-type S/D of the PMOS transistors (not shown) and, simultaneously, of the p$^+$-type central section 161.2 of the cap portion 161 (FIG. 9B). In addition, the second cycle includes a multiplicity of higher energy n$^{--}$-type implants $N_{22}$, $N_{23}$ and $N_{24}$, corresponding to various implants associated with the fabrication of PMOS transistors. For example, $N_{24}$ represents the n$^{--}$-type tub implant, whereas $N_{22}$ and $N_{23}$ represent a variety of well known PMOS transistor n$^{--}$-type implants (e.g., a valley-fill implant, a punch-through implant, a LDD/ extension implant, a MDD implant, and a threshold-adjust implant, all functionally similar to those described above for the NMOS transistors). The second cycle implants $N_{22}$, $N_{23}$ and $N_{24}$ also form the $n^{--}$-type pedestal portion 162 of the p-type tub tie (FIG. 9B), as well as the peripheral portions 151.1 of the n-type tub-tie (FIG. 10A).

In addition, the shape of the isolating regions 120, 122, 124 and 126 may be formed and or approximated in a variety of ways. As for material composition, these regions may comprise, for example, an oxide of the underlying semiconductor (e.g., $SiO_2$) or a combination of such an oxide and PR. (PR would be utilized for processing only, and would not be incorporated into the final IC.) As for the shape of the protrusion, a precise rectangle as depicted in the schematic drawing of FIGS. 9–10 is not essential. The protrusion may be triangular, tapered or irregular; its edges may be straight or curved. For example, as shown in FIG. 11, the shape of the field oxide (FOX) thermally grown by a well known LOCOS process may be utilized to approximate the shape of the protrusions 120.1, 122.1, 124.1 and 126.1 and to achieve the desired shape of the cap and pedestal portions of the tub-tie region. The FOX typically has a central section of relatively uniform thickness of at least $t_{max}$ and tapered end sections that include regions of thickness corresponding to both $t_{min}$ and $t_{max}$. Thus, the tapered end sections can be used to approximate the rectangular protrusions as depicted by the phantom overlay of the latter in FIG. 11. Moreover, FIGS. 9–11 illustrate that the width d of the protrusion (i.e., the distance between $t_{min}$ and $t_{max}$ in FIG. 11) should be sufficiently large that the pedestal portion does not inadvertently pinch off the cap portion of the tub-tie.

Alternatively, the tub-tie design may be realized as part of a modified STI process. For example, after oxide-filled trenches are formed in a semiconductor (e.g., Si) body, the oxide overlays the entire surface of the body, including the semiconductor pillars between adjacent trenches. A tub-tie region is formed in one or more of the pillars. The desired protrusions are achieved by depositing PR over the oxide, forming openings in the PR where the central section (e.g., sections 151.2 and 161.2 of FIGS. 9B and 10B, respectively) is to be formed, and then etching (e.g., RIE) away the exposed oxide. Compared to a LOCOS process described more fully in the illustration which follows, this STI process has an extra PR mask step. However, this extra PR step may be eliminated by utilizing a modified trench etching procedure of the type described by C. P. Chang et al., IEDM, Washington DC, Dec. 7–10, 1997, Technical Digest, pp. 661–664, which is incorporated herein by reference. More specifically, the trench in the Si body is formed between raised nitride/pad-oxide features, but with sidewalls of lower slope than used by Chang et al., supra. Then, the trench is filled with oxide and planarized relative to the top of the nitride. Lastly, the wafer is re-oxidized so as to grow additional oxide along the sidewalls of the trench and under the nitride/pad-oxide features. The resulting oxide shape approximates that of LOCOS FOX, particularly the protrusion feature used to selectively dope the various sections of the tub-tie.

LOCOS Illustration

With reference now to FIGS. 1–8, we describe the front-end fabrication of a CMOS IC in which the isolating regions are formed by a LOCOS process. FIG. 1 depicts a first stage in the fabrication of the IC after a number of processing steps have been completed; namely, a pad oxide layer 12 has been grown on a single crystal semiconductor body 10, illustratively a silicon substrate. A silicon nitride (hereinafter nitride) layer 14 is deposited on the pad oxide layer 12. A first PR mask 16, formed on the nitride layer 14, is photolithographically patterned to define an opening 18 which exposes portions of the underlying nitride layer. A pair of PR pillars 16.1 segment the opening 18 into three sections: a central section 18.1 where a central isolating region (i.e., FOX region 20, FIG. 3) will be formed, and a pair of lateral sections 18.2 where lateral isolating regions (i.e., FOX regions 22 and 24, FIG. 3) will also be formed. Next, the nitride layer is etched (e.g., by a RIE process), and the PR is removed leaving two nitride pillars 14.1 as shown in FIG. 2. Ultimately, tub-tie regions will be formed in the regions of the substrate under the nitride pillars 14.1. Now, the FOX regions 20, 22 and 24 are thermally grown in the areas of the substrate surface not covered by the patterned nitride layer. After FOX growth is completed, the pad oxide layer 12 and the remaining portions of the nitride layer are removed as shown in FIG. 3.

Next, the formation of the gate structures of the NMOS and PMOS transistors are begun by the sequential formation of a multiplicity of layers not shown: a gate oxide layer, a polycrystalline silicon layer, and other layers (not shown, but well known in the art) which may be used to facilitate processing. A second PR mask is photolithographically patterned to form two resist pillars over the regions where the gate stacks 32 and 36 (FIG. 4) are to be formed. Then, the layers of the gate stack are sequentially etched, and the resist pillars are removed, leaving the pair of gate stacks 32 and 36. At this stage, each gate stack comprises a gate oxide layer on the substrate, a polycrystalline layer on the gate oxide layer and, as above, other layers (not shown, but well known in the art) which may be used to facilitate processing. Then, optional silicon dioxide spacers are formed on the sides of the gate stacks. The resulting intermediate structure of the IC is shown in FIG. 4 where the spacers are designated by reference numeral 34 and 38, the gate stacks by numerals 32 and 36, and the gate oxide by numeral 30.

At this stage a well-known screen oxide layer (not shown) could be formed over the structure in order to protect exposed portions of the substrate during subsequent ion implantation steps.

Note, to this point in the front-end process sequence only two PR masks have been utilized and no ion implantation steps have been performed. In fact, as the following description will demonstrate only two more PR masks are required to complete the front-end of the IC, and, during each of two implantation cycles, all of the ion implantation steps are sequentially performed with no intervening photolithography step. More specifically, FIG. 5 shows that a third PR mask 40 is formed on the top surface of the intermediate structure of FIG. 4. The mask is photolithographically patterned so as to expose the locations 40.4 where the NMOS transistors are to be formed and the location 40.3 where the tub-tie to the n-type tub is to be formed. However, the locations of the PMOS transistors and the tub-tie to the p-type tub remain masked. At this stage all of the desired ion implants for the NMOS transistors and some of the implants for the n-type tub-tie are performed, without intervening photolithographic mask steps. These implantation steps may include one or more of the following illustrative implants: tub implants, isolation implants, threshold implants, LDD/extension implants, MDD implants, S/D implants, and polysilicon gate implants. From the perspective of forming the tub-tie regions, however, the S/D implants also form the more heavily doped central sections 51.2 (FIG. 7) of the cap portions 51, whereas the other implants form the more lightly doped peripheral sections 51.1 of the cap portions 51, and the more lightly doped buried pedestal portions 52.

Figure 7:
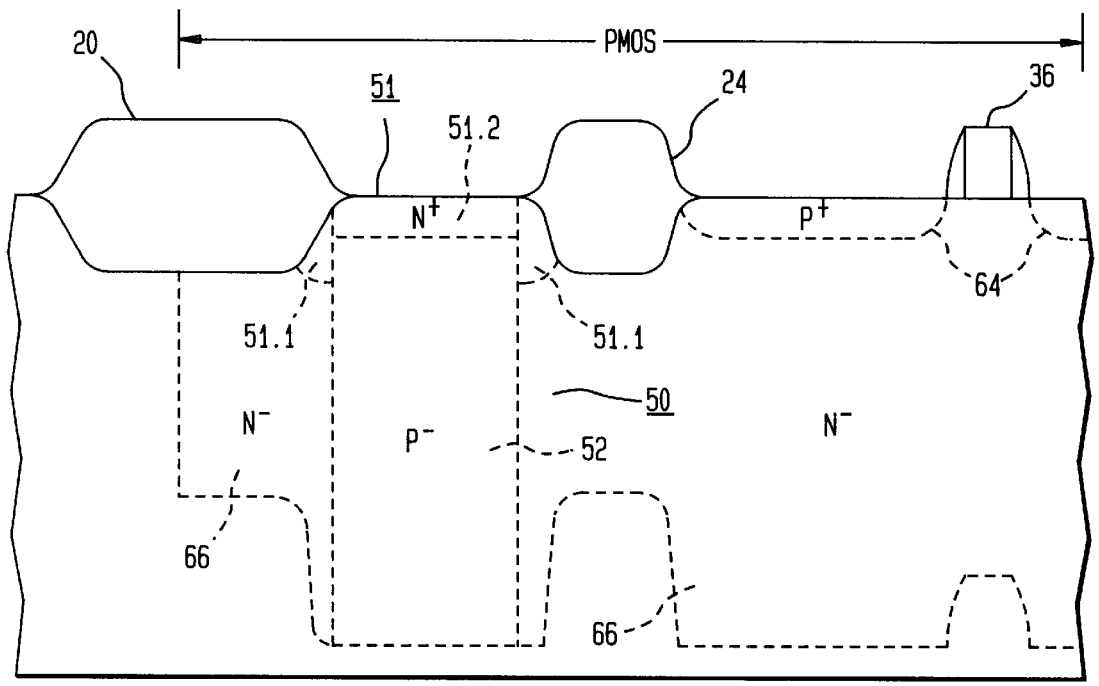

More, specifically the relatively shallow S/D implants form the $n^+$-type S/D regions 44 of the NMOS transistors (FIGS. 5 and 8) and the $n^+$-type central section 51.2 of the cap portion 51 of the tub-tie region 50 (FIGS. 5 and 7). On the other hand, the deeper implants (e.g., tub implant, valley-fill implant etc.) form the $p^{--}$-type tub 46 of the NMOS transistors and the $p^{--}$-type buried pedestal portion 52 of the tub-tie region 50. Significantly, as shown in FIG. 7, the pedestal portion 52 does not intersect the adjacent FOX regions 20 and 24; i.e., at least a top section of the pedestal portion 52 is surrounded by the cap portion 51, so that at least one $n^{--}$-type peripheral section 51.1 forms a conducting path between the $n^+$-type central section 51.2 of cap portion 51 and the $n^{--}$-type tub 66. Illustratively, two such peripheral sections 51.1 are formed as shown in FIGS. 5 and 7. For simplicity the ohmic metal contact to the cap portion has been omitted. It is this contact that would be connected to $V_{cc}$ or ground, as is well known in the art.

As described earlier with reference to FIGS. 9–11, the peripheral section 51.1 between the pedestal 52 and the FOX regions 20 and 24 is realized by exploiting the shape of the FOX regions in conjunction with suitable PR masks and by controlling the ion implantation energies of the dopants so that, in the peripheral sections 51.1, the $n^{--}$-type dopant penetrates the FOX sufficiently to form a conducting path between the $n^+$-type central section 51.2 and $n^{--}$-type tub 66, while the $p^+$-type S/D implant is a wholly absorbed (or nearly so) by the curved section of the FOX. In contrast, in the pedestal portion 52, the $p^{--}$-type dopant penetrates deeper into the semiconductor than the $n^+$-type dopant in the central section 51.2, thereby forming a buried $p^{--}$-type pedestal portion 52 below the $n^+$-type central section 51.2 of the cap portion. In addition, the dopant concentrations are controlled so that the $n^+$-type concentration in the central section 51.2 is much higher than that of the $p^{--}$-type dopant in the pedestal portion 52; i.e., in the central section 51.2, where the two dopant species overlap, the $n^+$-type dopant will be predominant because the $p^{--}$-type dopant will not compensate the $n^+$-type dopant to any significant extent. Thus, the central section 51.2 of the cap portion forms an essentially ohmic contact with the metal tub-tie contact layer (not shown) thereto.

Figure 8:
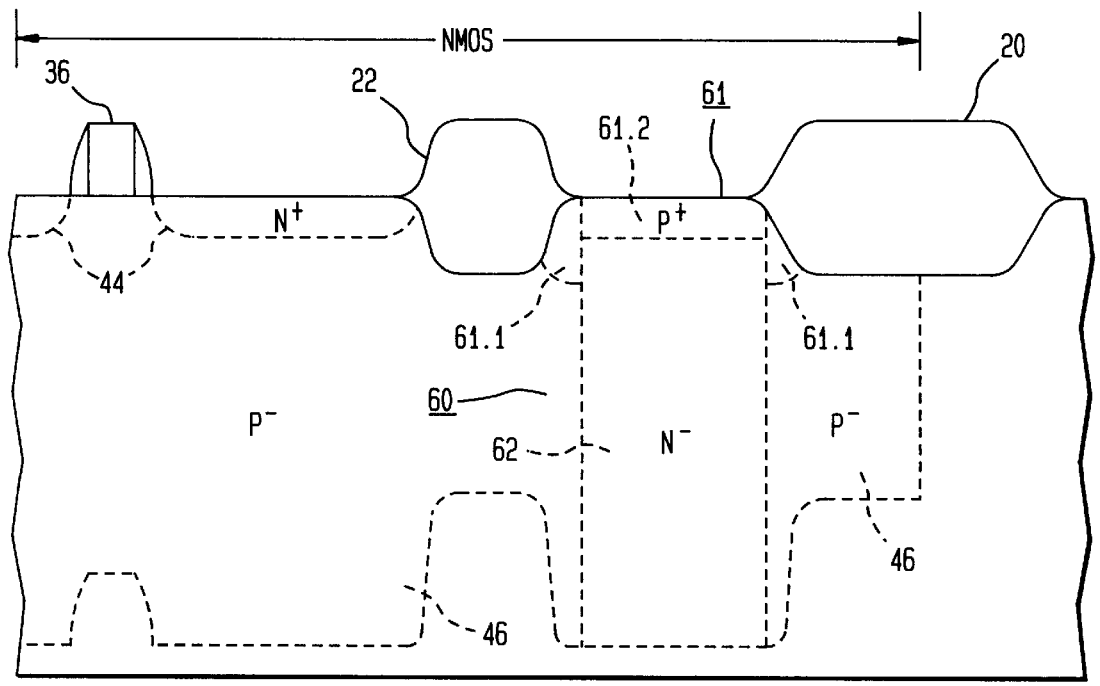

After these implantation steps are completed, the remaining portions of the third PR mask 40 are removed. Then, as shown in FIGS. 6 and 8, a fourth PR mask 70 is patterned on the structure in order to form the PMOS transistors and the tub-tie 60 to the p-type tub 46. The basic process described above is repeated, but with the conductivity types of the various dopant species reversed as would be well known in the art. In the interest of brevity, the details will not be repeated here. Instead, reference will be made to the desired result: i.e., the PMOS transistors are formed as shown in FIG. 6, and the tub tie region 60 to the p-type tub 46 as shown in FIG. 8. As before, the tub-tie 60 comprises a $p^+$-type cap portion 61 which surrounds at least a top section of an $n^{--}$-type pedestal portion 62. The cap portion includes a $p^+$-type central section 61.2 and $p^{--}$-type peripheral sections 61.1 that establish a conducting path between the central section 61.2 of the cap portion 61 and the $p^{--}$-type tub 46. Again, the ohmic contact to the cap portion is not shown.

Of course, the sequence of forming the transistors is not critical; i.e., the PMOS transistors can be formed first rather than last, and conversely for the NMOS transistors.

In summary, it is apparent from the foregoing that the embodiments described require only four photolithography steps in contrast with ten such steps typical of standard CMOS IC front-end processing. Yet, the making of tub-ties is realized even though a reduced-mask-count IC fabrication process is employed.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. An integrated circuit comprising:
   a tub of a first conductivity type disposed in a semiconductor body,
   at least one transistor embedded in said tub,
   a pair of isolating regions, and
   a tub-tie region disposed between said isolating regions, said tub-tie region comprising a cap portion of said first conductivity type and an underlying buried pedestal portion of a second conductivity type, said cap portion surrounding at least a top section of said pedestal portion so that a conducting path is formed between said cap portion and said tub.

2. The invention of claim 1 wherein said cap portion is wider than said top section of said pedestal portion, and wherein said cap portion comprises a central section which is more heavily doped than said pedestal portion and peripheral sections which are less heavily doped than said central section.

3. The invention of claim 2 wherein said isolating regions each has a protrusion, said protrusions extending toward one another over said peripheral sections, said peripheral sections separating said central section and said pedestal portion from said isolating regions.

4. A CMOS integrated circuit comprising:
   a p-type tub and an n-type tub disposed in a semiconductor body,
   at least one NMOS transistor embedded in said p-type tub, a first pair of isolating regions, a first tub-tie region disposed between said first isolating regions and coupled to said p-type tub, said first tub-tie region comprising a first p-type cap portion and an underlying buried n-type first pedestal portion, at least a top section of said first pedestal portion being surrounded by said first cap portion so that a first conducting path is formed between said first cap portion and said p-type tub; and
   at least one PMOS transistor embedded in said n-type tub, a second pair of isolating regions, a second tub-tie region disposed between said second isolating regions and coupled to said n-type tub, said second tub-tie region comprising a second n-type cap portion and an underlying buried p-type second pedestal portion, at least a top section of said second pedestal portion being surrounded by said second cap portion so that a second conducting path is formed between said second cap portion and said n-type tub.

5. The invention of claim 4 wherein each of said cap portions is wider than the top section of its corresponding pedestal portion, and wherein each of said cap portions has a central section which is more heavily doped than said corresponding pedestal portion and peripheral sections which are less heavily doped than said central section.

6. The invention of claim 4 wherein said first and second pairs of isolating regions have an isolating region in common with one another.

7. The invention of claim 4 wherein said isolating regions each has a protrusion, said protrusions extending toward one another over said peripheral sections, said peripheral sections separating said central section and said pedestal portion from said isolating regions.

8. The invention of claim 1 wherein said cap portion physically contacts each of said isolating regions.

9. The invention of claim 4 wherein said first cap portion physically contacts each of said first isolating regions, and said second cap portion physically contacts each of said second isolating regions.

* * * * *